(12) United States Patent
Stolze

(10) Patent No.: US 7,291,914 B2
(45) Date of Patent: Nov. 6, 2007

(54) POWER SEMICONDUCTOR MODULE

(75) Inventor: Thilo Stolze, Arnsberg (DE)

(73) Assignee: EUPEC Europaeische Gesellschaft fur Leistungshalbleiter mbH (DE)

( * ) Notice: Subject to any disclaimer, the term of this patent is extended or adjusted under 35 U.S.C. 154(b) by 76 days.

(21) Appl. No.: 11/297,980

(22) Filed: Dec. 9, 2005

(65) Prior Publication Data
US 2006/0150751 A1    Jul. 13, 2006

Related U.S. Application Data

(63) Continuation of application No. PCT/EP2004/003375, filed on Mar. 31, 2004.

(30) Foreign Application Priority Data
Jun. 10, 2003  (DE) ............................... 103 26 176

(51) Int. Cl.
*H01L 23/34* (2006.01)
(52) U.S. Cl. .................. 257/719; 257/704; 257/718; 257/724; 257/E23.193
(58) Field of Classification Search ................ 257/719
See application file for complete search history.

(56) References Cited

U.S. PATENT DOCUMENTS

| | | | |
|---|---|---|---|
| 4,609,937 A | 9/1986 | Takeuchi et al. | ............... 357/79 |
| 4,788,626 A * | 11/1988 | Neidig et al. | ................ 361/715 |
| 4,887,149 A | 12/1989 | Romano | ........................ 357/81 |
| 5,705,853 A | 1/1998 | Faller et al. | ................ 257/719 |
| 6,297,549 B1 | 10/2001 | Hiyoshi | ....................... 257/703 |
| 7,034,395 B2 * | 4/2006 | Stolze | ......................... 257/718 |
| 2004/0164388 A1 | 8/2004 | Stolze | ......................... 257/678 |
| 2004/0217465 A1 | 11/2004 | Stolze | ......................... 257/706 |

FOREIGN PATENT DOCUMENTS

| | | |
|---|---|---|
| DE | 101 42 971 A1 | 3/2003 |
| DE | 101 49 886 A1 | 4/2003 |
| EP | 0 067 575 A2 | 12/1982 |
| EP | 0 254 692 A1 | 1/1988 |
| EP | O 762 496 A2 | 3/1997 |

OTHER PUBLICATIONS

PCT International Search Report application No. PCT/EP2004/003375, 4 pages, mailing date Jul. 16, 2004.

* cited by examiner

*Primary Examiner*—Tu-Tu Ho
(74) *Attorney, Agent, or Firm*—Coats & Bennett, P.L.L.C.

(57) ABSTRACT

A power semiconductor module has a substrate (1) on which several pressure elements (16, 17, 18, 19) perform a mechanical pressure (F) at different areas (10, 11, 12, 13) thereof in a direction of a cooling element in order to press the underside (1b) of the substrate and reject heat towards said cooling element. In order to apply an essentially even and non-influenced by the component tolerances force to each area of the substrate, the pressure elements perform an elastic action on the substrate areas. The pressure elements (16, 17, 18, 19) are formed on the first part (21) of a housing which is movable with respect to the second part (22) thereof provided with spacing elements (30, 31, 32, 33) defining a supporting surface (34) in such a way that the first part (21) of the housing is fixed at a certain distance from the substrate (1).

20 Claims, 2 Drawing Sheets

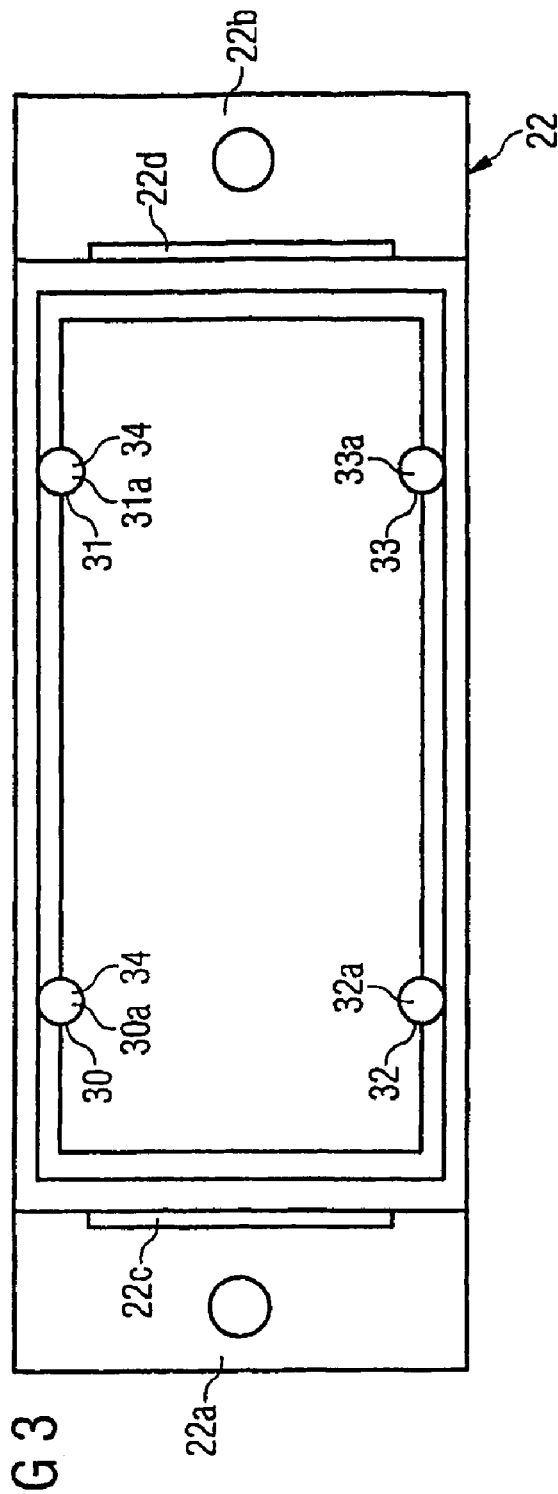
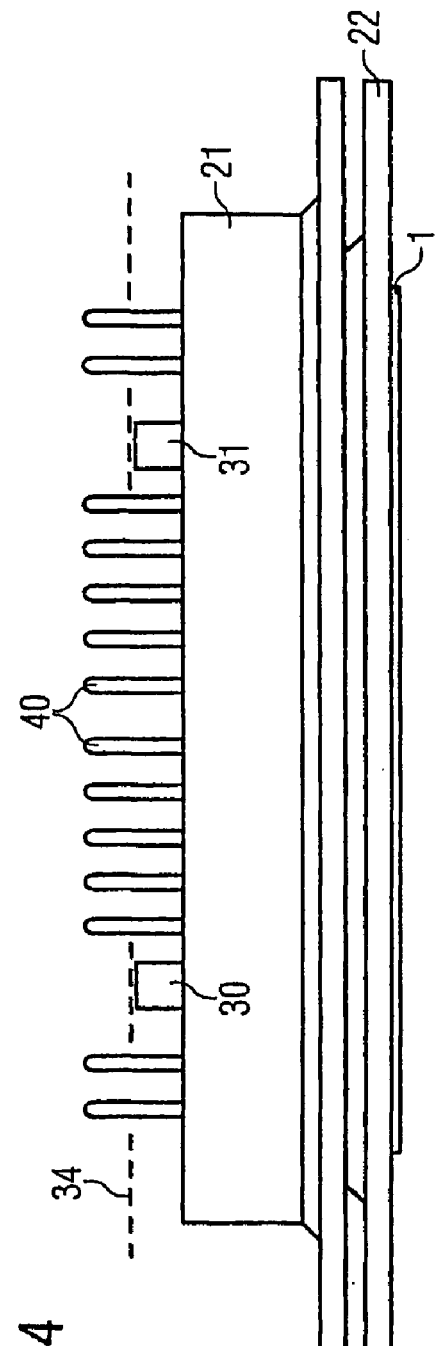
FIG 3
FIG 4

POWER SEMICONDUCTOR MODULE

CROSS-REFERENCE TO RELATED APPLICATIONS

This application is a continuation of co-pending International Application No. PCT/EP2004/003375 filed Mar. 31, 2004, which designates the United States of America, and claims priority to German application number DE 103 26 176.1 filed Jun. 10, 2003, the contents of which are hereby incorporated by reference in their entirety.

TECHNICAL FIELD

The invention relates to a power semiconductor module having a substrate, on the top side of which at least one semiconductor component is arranged and the underside of which can be pressed onto a cooling element for the purpose of dissipating heat, and having a plurality of contact pressure elements which exert mechanical pressure on various substrate locations in the direction of the cooling element, the contact pressure elements being formed as integral parts of a housing and acting in a resilient manner on the substrate locations.

BACKGROUND

DE 101 42 971 A1 describes a power semiconductor module containing a ceramic substrate which is fitted with semiconductor components. The semiconductor components are contact-connected to interconnects on the top side of the substrate, said interconnects leading, inter alia, to contact pins for externally connecting the module.

The underside of the substrate is copper-coated and functions as a heat-dissipating contact area in order to be able to dissipate power losses—which occur in the form of heat—to a heat sink or a cooling element during operation of the semiconductor components.

The substrate is surrounded by a (plastic) module housing and is pressed onto the heat sink by means of screw connections, for example. Continuous area contact (which is free of air inclusions) between the underside of the substrate and the heat sink is desirable for optimum heat dissipation. However, as a result of the high-temperature production process, the substrate is subject to internal mechanical stresses on account of different coefficients of expansion of the conductor (e.g. copper) and the substrate (e.g. ceramic). These mechanical stresses may also be intensified by subsequent production steps (e.g. soldering operations). As a result, curvature of the substrate often cannot be avoided, with the result that the contact area for the heat sink is not planar.

In order to counteract this problem, external or housing-internal pressure stamps are provided in the module disclosed in DE 101 42 971 A1, said pressure stamps transmitting externally applied pressure to various points or locations of the substrate in order to press the substrate, as uniformly as possible, onto the heat sink. This is assisted by the substrate being advantageously subdivided into a plurality of cohesive substrate regions which can be moved relative to one another to a limited extent.

However, substrates having a relatively large areal extent, in particular, are extremely sensitive to the individual contact pressure force that is acceptable at the individual locations. DE 101 49 886 A1 therefore followed the route of connecting the contact pressure elements to the housing in a resilient manner in order to be able to set the pressing-on pressure in an improved manner using the spring forces.

In this case, however, it proves to be problematic, in the case of a relatively large number of individual contact pressure elements, to use the latter to uniformly apply pressure, particularly in the central inner region of the substrate. If an excessively high external force is applied, this leads to locally excessive pressing-on with excessive pressure and to the risk of the brittle ceramic breaking. If, in contrast, the contact pressure force is selected to be excessively low overall in order to avoid damage to the substrate, regions remain which are not in contact with the heat sink. In the case of an external force which is introduced via the module housing, for example, component tolerances additionally have a disadvantageous effect since they may lead to pressure being applied to the individual substrate locations to differing degrees.

SUMMARY

Therefore, the present invention is based on the object of developing a power semiconductor module of the type mentioned initially to the effect that uniform area contact between the underside of the substrate and the cooling element can be realized in a cost-effective manner, the individual operations of applying pressure to the individual substrate locations being essentially the same and not being influenced by component tolerances.

According to the invention, this object is achieved, in the case of a power semiconductor module of the type mentioned initially, by virtue of the fact that the contact pressure elements are integrally formed on a first housing part which can be moved relative to a second housing part, and the second housing part has spacer elements which define a bearing area for the first housing part at a fixed distance from the substrate.

A first fundamental aspect of the invention is thus that the individual contact pressure forces are applied to the substrate locations (to which said forces are to be applied) via individually flexible, i.e. elastic, resilient elements. The spring movement provided makes it possible to compensate for spacing tolerances and component tolerances. A contact pressure force which is adequate for area contact is thus advantageously applied to the respective substrate location without the risk of the substrate being destroyed—at least within wide tolerance ranges.

One aspect of the invention which is important in terms of production technology is that the contact pressure elements are formed as integral parts of a module housing. This has the advantage that the contact pressure elements can be produced with the housing and can be easily installed with the latter.

A final fundamental aspect of the invention is finally that the distance between the first housing part (which comprises the spacer elements) and the substrate is firmly defined and complied with by the second housing part, with the result that the distance is not shortened as a result of tolerances of the module housing, which could lead to a high pressing-on pressure until the substrate is destroyed.

One refinement of the invention which is advantageous in terms of design and production technology provides for the contact pressure elements to be in the form of webs or stamps and thus to produce a particularly precisely defined contact pressure.

In this case, the resilient regions are preferably formed from housing regions or regions of the contact pressure elements having material recesses or thinned sections of material.

As regards the installation and the production of the module according to the invention, provision is preferably made for the module housing to have regions for mechanical connection to the cooling element only on two opposite sides. These connections which are implemented, for example, in the form of a screw fixing are used to produce, via the housing, the contact pressure force which acts on the individual substrate locations via the individual resilient contact pressure elements which are provided according to the invention and have a contact pressure force that can be individually varied (depending on the spring movement or spring excursion).

A structural height—which is dimensioned within narrow tolerances—of a module is often required, so that contact pins which emerge, for example, from the top side of the module are at a prescribed distance from stop areas on the module (for example for a mounting board). This is ensured in a simple manner according to this refinement of the invention, with deformation or displacement (which is subject to tolerances) of the contact pressure elements and of the first housing part not having any effect on the second housing part and thus on the bearing area(s).

BRIEF DESCRIPTION OF THE DRAWINGS

The present invention can be used particularly advantageously to supplement the refinement (described in DE 101 42 971 A1) of a substrate in the form of substrate regions which are cohesive but can be moved relative to one another within limits.

The invention will be explained in more detail below with reference to the exemplary embodiments which are illustrated in the figures of the drawing, in which:

FIG. 3 shows a second housing part of the module shown in FIG. 1, and FIG. 4 shows a side view of the module shown in FIG. 1, which has been completed with connection contacts.

DETAILED DESCRIPTION

Figure 1:
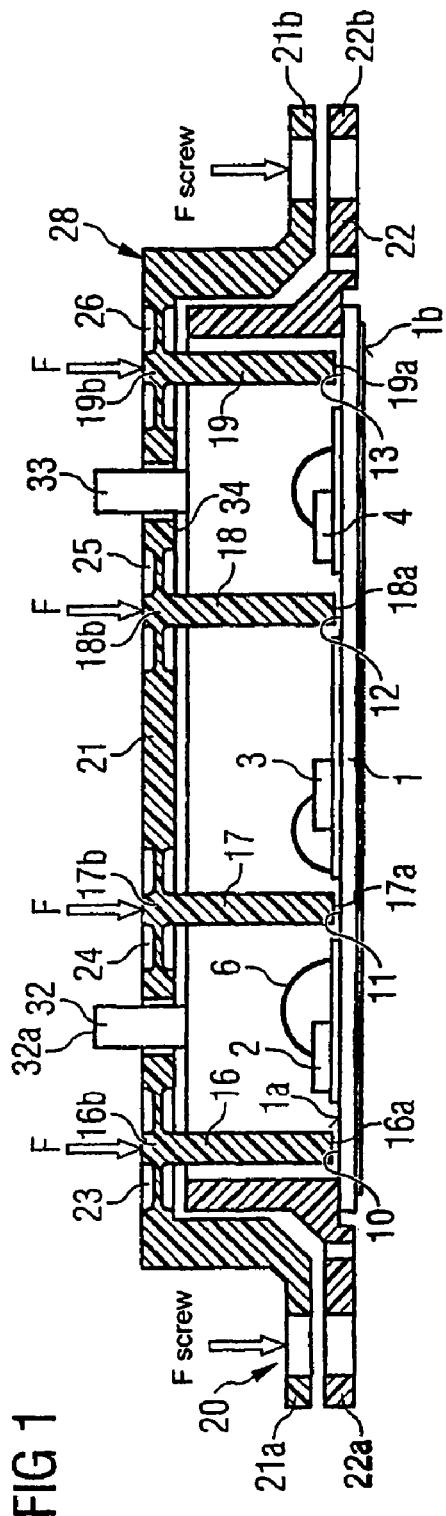
FIG. 1 shows a longitudinal section through an exemplary embodiment of a power semiconductor module according to the invention.

FIG. 1 shows a power semiconductor module according to the invention having a substrate 1 with a (copper-) coated top side 1a and a (copper-) coated underside 1b. A plurality of power semiconductor components 2, 3, 4 are arranged on the top side and are connected, by means of bonding wires 6, to interconnects which are not illustrated in any more detail and are formed in the coating. Contact pressure locations 10, 11, 12, 13 are provided at defined substrate locations, partly between the semiconductor components. Compressive forces for uniform contact pressure are exerted on these locations in order to achieve continuous area contact (which is free of air gaps) between the underside of the substrate 1b and a cooling element (not illustrated).

To this end, a plurality of individual contact pressure elements 16, 17, 18, 19 which are in the form of webs or stamps are provided. The free ends 16a, 17a, 18a, 19a of the contact pressure elements come into contact with the contact pressure locations 10, 11, 12, 13 during further installation (as also described below).

The substrate and the semiconductor components are surrounded by a plastic housing 20 which is formed from two housing parts 21, 22. The first housing part 21 has lateral flanges 21a, 21b each having a hole for a screw connection to the cooling element (not illustrated). The contact pressure elements 16, 17, 18, 19 are integrally formed on the housing part 21 as integral parts and were preferably formed together with the housing part in the joint injection molding process, with the result that their other ends 16b, 17b, 18b, 19b are connected to the housing part 21.

It has been found that it is problematic to apply a common external force for subjecting all of the substrate locations to a uniform contact pressure. As a result of component tolerances or substrate regions which are not planar, locally excessive compressive forces could arise and could result in destruction of the substrate.

Provision is therefore made for the contact pressure elements 16, 17, 18, 19 to act on the contact pressure locations 10, 11, 12, 13 in a resilient manner. To this end, the ends 16b, 17b, 18b, 19b of the contact pressure elements may be connected to the housing part 21 via regions 23, 24, 25, 26 having a thinned section of material or material recesses. However, it is likewise conceivable for the contact pressure elements themselves to be provided with a spring or to be of spring-elastic design.

Figure 2:
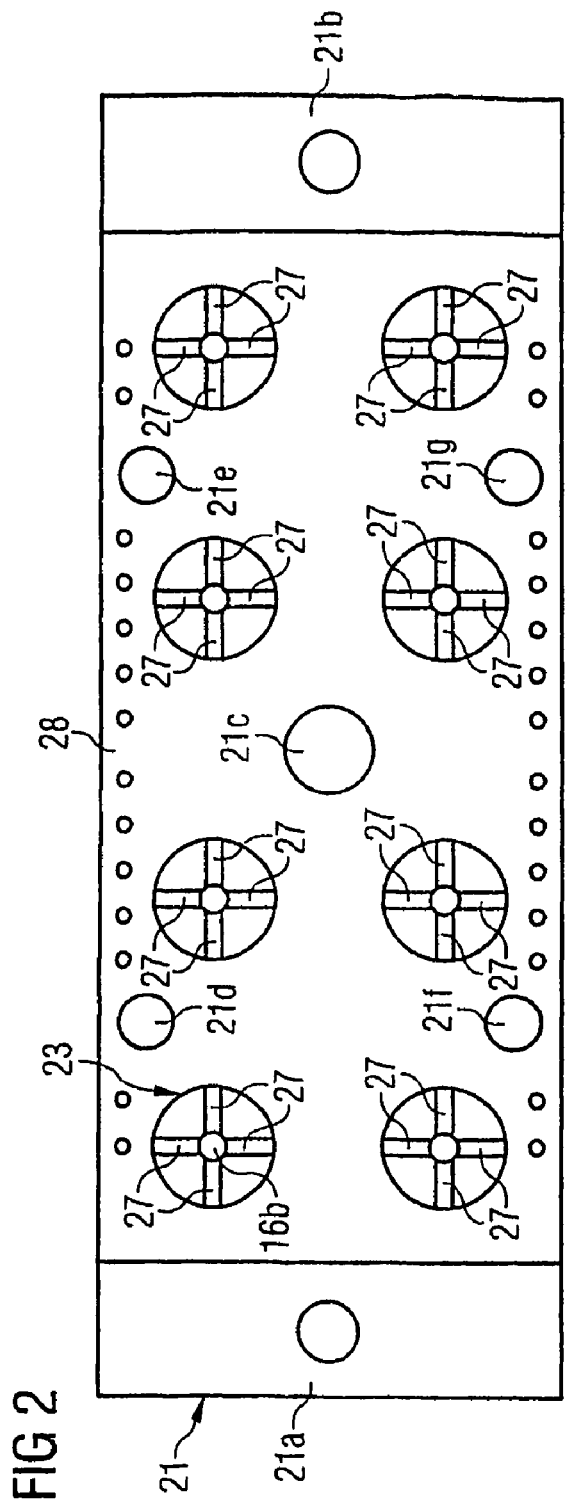
FIG. 2 shows a first housing part of the module shown in FIG. 1.

This refinement which is shown in detail in FIG. 2 may comprise, for example, cruciform resilient webs 27 (whose material has been thinned) in the region of the housing covering side 28. (FIG. 2 shows a total of eight contact pressure elements but, for the sake of simplicity, the further description refers only to individual elements which are also specifically designated in FIG. 1, for example 16.). The other end (for example 16b) of each contact pressure element (for example 16) is thus mounted resiliently in the vertical direction so that it can be resiliently deflected in an appropriate manner in the case of a contact pressure movement that has been reduced as a result of component tolerances or curvature of the substrate location 10, and the compressive force exerted on the substrate location 10 thus does not become excessively high.

In other words: elastic deformation gives rise to a measured contact pressure force which is reduced, if necessary, and is transmitted to the substrate. The pressing-on force $F_{screw}$ (FIG. 1) which is produced when the housing parts are being screwed on is distributed to the contact pressure locations in the desired order of magnitude. Adequate contact pressure forces F can thus also be realized in the center of the substrate without producing excessive contact pressure forces in the outer region of the substrate, for example.

As FIG. 1 also illustrates, the housing part 21 surrounds the second, inner housing part 22 which is adhesively bonded to the top side of the substrate 1a in a liquid-tight manner and forms a leaktight space which, if required, can be filled with a (dielectric) potting compound through a filling opening 21c (FIG. 2) in the housing part 21.

As FIG. 3 also shows, the second housing part 22 has mandrels or domes 30, 31, 32, 33 at the top, the end areas 30a, 31a, 32a, 33a of which define a bearing plane 34 for the module. The housing part 22 likewise has lateral flanges 22a, 22b each having a hole for a screw connection to the cooling element (not illustrated). The flanges are mechanically uncoupled from the rest of the housing part 22 by means of joints or slots 22c, 22d in order to avoid any possible stresses of the screw connection being transmitted to the substrate.

As FIG. 2 also illustrates, the housing part 21, in addition to the holes in the flanges 21a, 21b, has further openings for contact pins (FIG. 4) and through-holes 21d, 21e, 21f, 21g through which the mandrels 30, 31, 32, 33 penetrate in a longitudinally displaceable manner. The housing part 21 can thus be displaced, in the vertical direction, relative to the housing part 22. In contrast, the housing part 22 is fixed relative to the substrate 1, with the result that the bearing plane 34 remains unaffected by any possible displacements of the housing part 21 and always defines a predetermined bearing or installation area. The installation height of the module thus remains constant.

For the purposes of installation, the housing parts 21, 22 are connected to the cooling element (not illustrated) by means of screws (not shown); these screw connections produce the forces designated $F_{screw}$ in FIG. 1. These forces act, as compressive forces F, on the individual contact pressure locations 10, 11, 12, 13 via the contact pressure elements. The external force $F_{screw}$ leads to a very uniform contact pressure on all of the contact pressure locations because the resiliently acting contact pressure elements 16, 17, 18, 19 largely compensate, as described, for component tolerances or top sides of substrates which are not planar and thus exert the same force F on all of the locations.

The module which is shown in FIG. 4 and has the housing parts 21, 22 and the substrate 1 is completed with external connection contacts 40 which penetrate the housing part 21. The installation depth of the contacts 40 is defined by the bearing plane 34 which is independent of the housing part 21.

LIST OF REFERENCE SYMBOLS

1 Substrate

1a Top side

1b Underside 2, 3, 4 Semiconductor components

6 Bonding wire 10, 11, 12, 13 Contact pressure locations 16, 17, 18, 19 Contact pressure elements 16a, 17a, 18a, 19a Free ends 16b, 17b, 18b, 19b Other ends 20 Plastic housing 21 Housing part 21a, 21b Lateral flanges 21c Filling opening 21d, 21e, 21f, 21g Through-holes 22 Housing part 22a, 22b Flanges 22c, 22d Slots 23, 24, 25, 26 Regions 27 Resilient webs 28 Housing covering side 30, 31, 32, 33 Domes 30a, 31a, 32a, 33a End areas 34 Bearing plane 40 Connection contacts $F_{screw}$ Forces F Forces

What is claimed is:

1. A power semiconductor module comprising:
   a substrate, on a top side of which at least one semiconductor component is arranged and an underside of which can be pressed onto a cooling element for the purpose of dissipating heat, and
   a plurality of contact pressure elements which exert mechanical pressure on various substrate locations in the direction of the cooling element, the contact pressure elements being formed as integral parts of a housing and acting in a resilient manner on the substrate locations, wherein the contact pressure elements are integrally formed on a first housing part which can be moved relative to a second housing part, and the second housing part has spacer elements which define a bearing area for the first housing part at a constant distance from the substrate independent from a contact pressure.

2. A power semiconductor module according to claim 1, wherein the contact pressure elements are in the form of webs or stamps.

3. A power semiconductor module according to claim 1, wherein the contact pressure elements are connected to the housing via resilient regions.

4. A power semiconductor module according to claim 3, wherein the resilient regions are formed from housing regions or regions of the contact pressure elements having material recesses or thinned sections of material.

5. A power semiconductor module according to claim 1, wherein the module housing has regions for mechanical connection to the cooling element only on two opposite sides.

6. A power semiconductor module according to claim 1, wherein contact pins which emerge from the top side of the module are at a prescribed distance from top surfaces of the spacer elements.

7. A power semiconductor module according to claim 1, wherein the substrate is in the form of substrate regions which are cohesive but can be moved relative to one another within limits.

8. A power semiconductor module comprising:
   a housing comprising a first and second housing part, wherein the first housing part can be moved relative to the second housing part,
   a cooling element,
   a substrate with a top side on which at least one semiconductor component is arranged and an underside which can be pressed onto the cooling element, and
   spacer elements arranged in the second housing part which define a bearing area for the first housing part at a fixed distance from the substrate independent from a contact pressure,
   a plurality of contact pressure elements formed integrally in said first housing part, the contact pressure elements exerting mechanical pressure on various substrate locations in the direction of the cooling element.

9. A power semiconductor module according to claim 8, wherein the contact pressure elements are in the form of webs or stamps.

10. A power semiconductor module according to claim 8, wherein the contact pressure elements are connected to the housing via resilient regions.

11. A power semiconductor module according to claim 10, wherein the resilient regions are formed from housing regions or regions of the contact pressure elements having material recesses or thinned sections of material.

12. A power semiconductor module according to claim 8, wherein the module housing has regions for mechanical connection to the cooling element only on two opposite sides.

13. A power semiconductor module according to claim 8, wherein contact pins which emerge from the top side of the module are at a prescribed distance from top surfaces of the spacer elements.

14. A power semiconductor module according to claim 8, wherein the substrate is in the form of substrate regions which are cohesive but can be moved relative to one another within limits.

15. A power semiconductor module comprising:
- a substrate, on a top side of which at least one semiconductor component is arranged and an underside of which can be pressed onto a cooling element for the purpose of dissipating heat, and
- a plurality of contact pressure elements which exert mechanical pressure on various substrate locations in the direction of the cooling element, the contact pressure elements being formed as integral parts of a housing and acting in a resilient manner on the substrate locations, wherein the contact pressure elements are integrally formed on a first housing part which can be moved relative to a second housing part, and the second housing part has mandrel elements and the first housing part has openings through which the mandrel elements are vertically guided such that the first housing rests on a bearing area of the second housing part at a fixed distance from the substrate.

16. A power semiconductor module according to claim 15, wherein the contact pressure elements are in the form of webs or stamps.

17. A power semiconductor module according to claim 15, wherein the contact pressure elements are connected to the housing via resilient regions.

18. A power semiconductor module according to claim 17, wherein the resilient regions are formed from housing regions or regions of the contact pressure elements having material recesses or thinned sections of material.

19. A power semiconductor module according to claim 15, wherein the module housing has regions for mechanical connection to the cooling element only on two opposite sides.

20. A power semiconductor module according to claim 15, wherein contact pins which emerge from the top side of the module are at a prescribed distance from top surfaces of the mandrel elements.

* * * * *